United States Patent
Unger

(10) Patent No.: US 7,817,488 B2
(45) Date of Patent: Oct. 19, 2010

(54) LOAD BALANCING BY USING CLOCK GEARS

(75) Inventor: Zohar Unger, Kfar Yona (IL)

(73) Assignee: SanDisk Corporation, Milpitas, CA (US)

( * ) Notice: Subject to any disclaimer, the term of this patent is extended or adjusted under 35 U.S.C. 154(b) by 200 days.

(21) Appl. No.: 11/961,889

(22) Filed: Dec. 20, 2007

(65) Prior Publication Data

US 2009/0161428 A1    Jun. 25, 2009

(51) Int. Cl.
G11C 5/14    (2006.01)
(52) U.S. Cl. .............. 365/226; 365/227; 365/228; 365/233.1
(58) Field of Classification Search ......... 365/226, 365/227, 228, 233.1
See application file for complete search history.

(56) References Cited

U.S. PATENT DOCUMENTS

| | | | |
|---|---|---|---|
| 5,378,935 A | | 1/1995 | Korhonen et al. ............ 327/114 |
| 5,784,598 A | | 7/1998 | Griffith ....................... 395/556 |
| 5,789,952 A | * | 8/1998 | Yap et al. .................... 327/114 |
| 5,954,820 A | * | 9/1999 | Hetzler ....................... 713/323 |
| 6,313,683 B1 | | 11/2001 | Block et al. ................. 327/295 |
| 6,424,194 B1 | * | 7/2002 | Hairapetian ................ 327/210 |
| 6,425,068 B1 | * | 7/2002 | Vorbach et al. ............... 712/18 |
| 6,438,697 B2 | * | 8/2002 | Atkinson .................... 713/320 |
| 6,609,211 B2 | * | 8/2003 | Atkinson .................... 713/323 |
| 6,762,629 B2 | * | 7/2004 | Tam et al. ................... 327/114 |
| 6,897,697 B2 | * | 5/2005 | Yin et al. .................... 327/210 |
| 6,922,111 B2 | * | 7/2005 | Kurd et al. .................... 331/48 |
| 6,930,521 B2 | * | 8/2005 | Wald ......................... 327/147 |
| 7,111,178 B2 | * | 9/2006 | Rusu et al. ................... 713/300 |
| 7,143,203 B1 | * | 11/2006 | Altmejd ....................... 710/16 |
| 7,144,152 B2 | * | 12/2006 | Rusu et al. ................... 374/141 |
| 7,149,909 B2 | | 12/2006 | Cui et al. ..................... 713/322 |
| 7,222,244 B2 | * | 5/2007 | Kawahara et al. ........... 713/300 |
| 7,224,563 B2 | * | 5/2007 | Naffziger .................... 361/115 |
| 7,228,446 B2 | * | 6/2007 | Jorgenson et al. ............ 713/322 |
| 7,276,925 B2 | * | 10/2007 | Dobberpuhl et al. ......... 324/763 |
| 7,434,171 B2 | * | 10/2008 | Clapper ...................... 715/771 |
| 7,451,332 B2 | * | 11/2008 | Culbert et al. .............. 713/320 |
| 7,464,276 B2 | * | 12/2008 | Rusu et al. ................... 713/300 |
| 7,500,122 B2 | * | 3/2009 | Won et al. ................... 713/320 |
| 7,502,699 B2 | * | 3/2009 | Guenther et al. .............. 702/61 |
| 7,516,350 B2 | * | 4/2009 | Chelstrom et al. .......... 713/500 |

* cited by examiner

*Primary Examiner*—Viet Q Nguyen
(74) *Attorney, Agent, or Firm*—Weaver Austin Villeneuve & Sampson LLP

(57) ABSTRACT

An electronic device is capable of monitoring internal components to predict changes in processing power needs. When a prediction is made, a clock control circuit can be instructed to increase the clock signal frequency in response to a predicted increase in processing power needs, or decrease the clock signal frequency in response to a predicted decrease in processing power needs. The control circuit can further balance other clock signal frequencies in order to satisfy constraints such as a power supply constraint.

6 Claims, 4 Drawing Sheets

US 7,817,488 B2

LOAD BALANCING BY USING CLOCK GEARS

BACKGROUND OF THE INVENTION

This invention relates to use of clock signals in electronic systems, in particular in nonvolatile memory systems that include a memory controller.

Electronic systems generally include multiple components which are in communication with each other and perform different functions as part of an overall system. One example of such an electronic system is a nonvolatile memory system. Nonvolatile memory systems are used in various applications. Some nonvolatile memory systems are embedded in a larger system such as a personal computer. Other nonvolatile memory systems are removably connected to a host system and may be interchanged between different host systems. Examples of such removable memory systems (removable memory units) include memory cards and USB flash drives. Electronic circuit cards, including non-volatile memory cards, have been commercially implemented according to a number of well-known standards. Memory cards are used with personal computers, cellular telephones, personal digital assistants (PDAs), digital still cameras, digital movie cameras, portable audio players and other host electronic devices for the storage of large amounts of data. Such cards usually contain a re-programmable non-volatile semiconductor memory cell array along with a controller that controls and supports operation of the memory cell array and interfaces with a host to which the card is connected. Several of the same type of card may be interchanged in a host card slot designed to accept that type of card. However, the development of the many electronic card standards has created different types of cards that are incompatible with each other in various degrees. A card made according to one standard is usually not useable with a host designed to operate with a card of another standard. Memory card standards include PC Card, CompactFlash™ card (CF™ card), SmartMedia™ card, MultiMediaCard (MMC™), Secure Digital (SD) card, a miniSD™ card, Subscriber Identity Module (SIM), Memory Stick™, Memory Stick Duo card and microSD/TransFlash™ memory module standards. There are several USB flash drive products commercially available from SanDisk Corporation under its trademark "Cruzer®." USB flash drives are typically larger and shaped differently than the memory cards described above. Other examples of removable memory units include Solid State Drives (SSDs), e.g. using SATA, PCIe, ExpressCard or similar standards. SSDs use solid state memory systems in applications where Hard Disk Drives (HDDs) have traditionally been used, such as in laptop computers.

In many electronic systems, there are power constraints or other constraints that the system must comply with. For example where a nonvolatile memory system is connected to a host, the host may only supply a limited amount of power. Using such power in an efficient manner is desirable.

SUMMARY

In one embodiment, an aspect of the present invention functions to balance clock signal frequencies in electronic devices subject to different operating constraints by monitoring and predicting changes in the processing power needs of internal components. When a component needs, or is predicted to need more processing power, a regulation circuit can quickly respond by increasing the component's clock signal frequency. Similarly, when a decrease in processing power is observed or predicted, the component's clock signal frequency can be decreased. Furthermore, a plurality of clock signal frequencies can be balanced to satisfy constraints such as power usage thresholds or pipeline performance constraints.

According to an embodiment of the present invention, an electronic device is provided which includes a clock control circuit that generates clock signals that determine the processing speed of internal electrical components. The electronic device also includes a regulation circuit that is connected to, and manages, the clock control circuit. The regulation circuit predicts changes in the processing power needs of electrical components, and increases the clock signal frequency if there is a predicted increase, or decreases the clock signal frequency if there is a predicted decrease, in processing power needs. The regulation circuit also balances other clock signal frequencies in response to changes resulting from predicted changes.

According to a second aspect of the current invention, a memory controller in a semiconductor memory device is provided that includes a plurality of memory cells. This device further comprises a clock control circuit that receives a master clock signal and generates one or more derived clock signals. An ECC circuit that performs error detection and correction processing is also included. The ECC circuit receives a clock signal generated by the clock control circuit, which controls the ECC circuit's speed of processing. The device also includes a regulation circuit that is capable of predicting a change in the ECC circuit's work load, wherein the ECC clock signal frequency is increased or decreased based on predicted changes in the ECC circuit's work load.

It is another object of the invention to provide a method of balancing the power consumption in an electronic device composed of a plurality of logic circuits, where each logic circuit receives a different clock signal that determines its processing speed. The method of the invention predicts changes in the processing power needs of the logic circuits. When an increase in the processing power need of a logic circuit is detected, the frequency of that logic circuit's clock signal is increased and the frequency of another logic circuit's clock frequency is decreased, thus balancing the overall power consumption.

DETAILED DESCRIPTION OF THE ILLUSTRATED EMBODIMENTS

Figure 1:
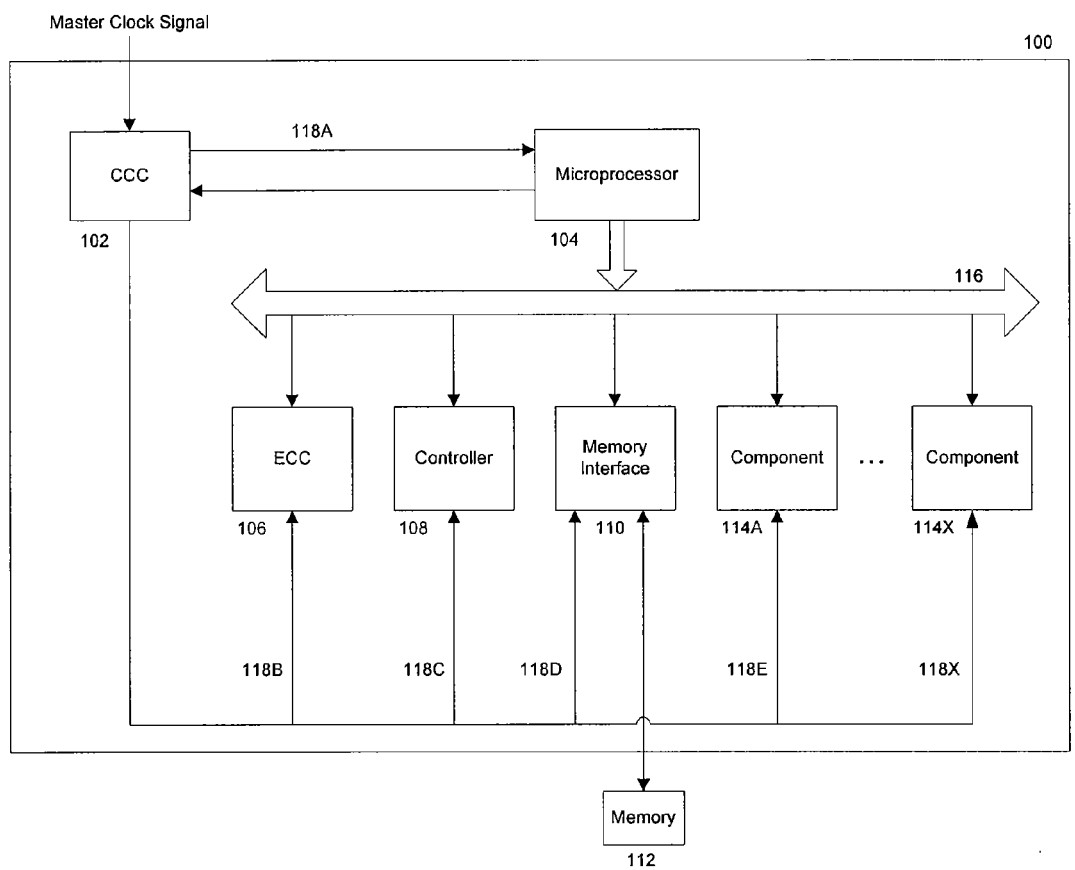
FIG. 1 shows a block diagram of an example electronic device composed of logic circuits according to an embodiment of the present invention.

FIG. 1 shows an exemplary electronic system, a nonvolatile memory system. Other electronic systems may also be used according to embodiments of the present invention, and the present invention is not limited to nonvolatile memory systems, or any other particular electronic system. FIG. 1 shows memory controller 100 that includes memory interface 110 for accessing memory array 112 and embedded ECC logic 106 for error correction and detection. Microprocessor 104 provides overall control, including synchronization, of controller 108, ECC circuit 106, memory interface 110, and other internal components 114A-114X.

Clock signals are used in electronic circuits, such as memory controllers, to control various internal logic circuits such as a microprocessor, memory interface circuitry, ECC circuitry, and other components. The clock frequency, also commonly referred to as "clock rate" or "clock speed", sets the pace of operations for each internal logic circuit within an electronic circuit. In general, as the frequency of the clock signal increases, the time to execute various operations or instructions by a logic circuit that is controlled by the clock signal decreases.

As semiconductor technology improves, logic circuitry like memory controllers are capable of operating at increased clock frequencies. While this increased processing power enables hardware manufacturers to design enhanced features, it also increases the overall power consumption of the electronic device. This problem is further exacerbated by the trend for increasingly smaller electronic devices, in particular mobile devices such as cell phones and laptop computers, which have more pronounced power constraints. The limited power available in such small devices makes it difficult to adequately supply the power required by today's power-hungry components.

Attempts have been made to reduce the power consumption by monitoring changes in the processing power needs of the logic circuits in a device, and reducing the clock speed for components when less processing power is needed. Examples of these methods include putting a device to "sleep" and "waking" it up when needed, or to operate different logic circuits with significantly reduced clock frequencies. These methods have the advantage of conserving the power supply when processing needs are low. This approach, however, is only capable of responding to detected changes in power needs after such changes have occurred. The power savings, therefore, are not optimal as the system takes time to respond to changes, and some changes could go undetected. This could be significant if the power supply is extremely constrained, or if the processing needs are volatile, thus requiring the monitoring mechanism to frequently respond to new changes.

The inability of these types of methods to predict changes in processing power needs also hinders their ability to load-balance a set of clock frequencies. Typically, these methods are only capable of adjusting the clock speed for a particular component in an independent manner, without reference to other clock signals in the device. This is a disadvantage in devices with significantly constrained power sources because if the processing power need of a single component rapidly increases, the clock frequency for that component would be increased in response, but without balancing the remaining clock frequencies, the device could easily exceed its power threshold. Furthermore, a group of components may be mutually dependent, such as pipelined components that are connected in series; in these cases, a change in the processing power need of one component may require adjustments to the clock speeds of other dependent components.

FIG. 1 shows a block diagram of an example electronic device 100 composed of logic circuits that receive clock signals from clock control circuit 102. Electronic device 100 may include a microprocessor 104 or some other type of control logic circuit for managing the clock control circuit 102 and other components. Microprocessor 104 could also receive a clock signal from clock control circuit 102; in this case, microprocessor 104 would essentially be monitoring its own processing power need since it both manages clock control circuit 102 and receives a clock signal from clock control circuit 102.

Electronic device 100 can further comprise other logic circuits such as ECC circuit 106, controller circuit 108, and memory interface circuit 110. Memory array 112 could also be connected to, or located internally within, electronic device 100. A person skilled in the art would understand that electronic device 100 could contain other components and circuits 114A-114X other than the ones shown. The logic circuits and components can be coupled to microprocessor 104 via a bus 116. Like the microprocessor, the logic circuits and components also receive clock signals generated by the clock control circuit 102. Although not shown, electronic device 100 may be powered by variety of power sources, such as AC power supplied over a connector line or some other type of internal power source such as batteries.

Clock control circuit 102 can receive a master clock signal (or a group of input clock signals) that is generated external to electronic device 100. Alternatively, clock control circuit 102 can generate the master clock signal itself. The master clock signal may be generated by an oscillator circuit, which functions by supplying a small amount of electricity to a crystal, such as quartz, that vibrates at a particular frequency when energized. The oscillator can control the quartz to precisely generate a master clock signal with a specific clock speed. Clock control circuit 102 can then use the master clock signal, regardless if it is externally supplied or internally generated, to produce multiple derived clock signals 118A-118X. Derived clock signals can be generated using special frequency multiplier and frequency divider circuits, which are well-known in the field.

In specialized devices such as memory controllers, some circuits and components operate much faster than others. Therefore, the derived clock signals can be set at varying frequencies depending on the particular component's processing needs. Typically the microprocessor needs a faster clock speed to handle its processing needs in controlling and instructing other components. For example, clock control circuit 102 could utilize a frequency multiplier to increase a 500 MHz master clock signal to a 1000 MHz derived clock signal suitable for use by microprocessor 104. Other components, on the other hand, can operate at lower clock speeds. Thus, a frequency divider can be used to decrease the same 500 MHz master clock signal to a 100 MHz derived clock signal suitable for use by controller circuit 108 or other components that can operate at slower speeds. Other components such as system buses and memory chipsets can use different clock rates as well depending on their specific operating requirements. The clock rates of certain components may also be mutually dependent in terms of pipeline performance. For example, the overall performance in a motherboard may not only depend on the CPU's clock speed, but also on other factors such as the clock rate of the front side bus and the clock rate of the RAM. For example, if the CPU is operating at 1000 MHz, but the memory is only operating at 500 MHz, then the memory becomes a bottleneck that forces the CPU to operate essentially at the slower 500 MHz rate while it waits for the memory to respond before it can complete its processing tasks.

Clock signals 118 and the master clock signal may be used as time references in electronic device 100 so that data can be transmitted and received synchronously with a known relationship to these references. Clock control circuit 102 can include delay lock loops ("DLLs") and/or phase lock loops ("PLLs") (not shown) to maintain a fixed time relationship between the clock signals where process, voltage, and temperature variations may skew these reference relationships over time. Various types of DLLs and PLLs are known in the art, including open or close loop type DLLs such as synchronous mirror delays. In general, DLLs and PLLs function by continuously comparing the relationship between two clock signals and providing feedback to adjust and maintain a fixed relationship between them.

ECC circuit 106 enables electronic device 100 to detect the presence of data signal errors, which may be caused by noise or other impairments, and to reconstruct the original, error-free data. For memory devices, memory errors are often characterized as "hard" or "soft" errors. Hard errors are typically caused by defects in the silicon or metallization of the memory package, and are usually permanent once manifest. Soft errors are usually transient and may be triggered by electrical or magnetic interference that cause bits of memory to flip to an incorrect state. As memory density increases and operating voltage decreases, memory devices generally become more susceptible to such interference. This is even more problematic with a multilevel cell memory that is comprised of multilevel cells, each of which is able to store more than one bit of data by using more than two memory states per cell. ECC circuit 106 can deal with these errors by using an error-correcting code to conform each data signal to specific rules of construction such that any errors (i.e., departures from this construction) in the received data signal can be automatically detected and corrected.

Figure 2A:
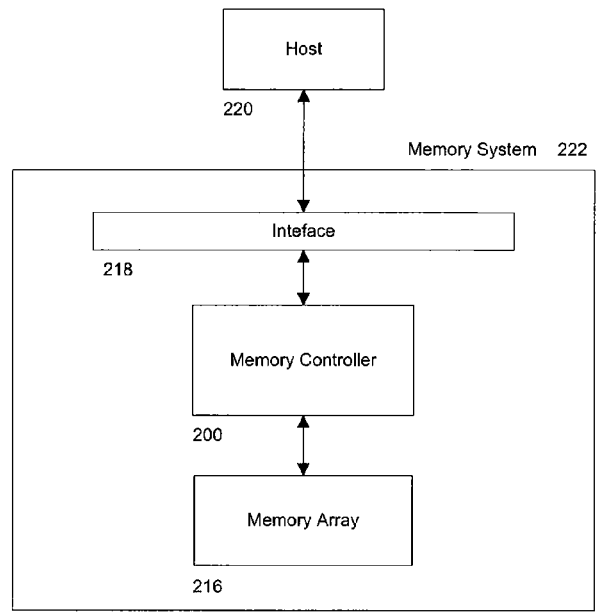
FIG. 2A shows an exemplary electronic system according to an embodiment of the present invention.

FIG. 2A shows an example of a nonvolatile memory system that includes interface 218, memory array 216, and memory controller 200, which may be similar to memory controller 100 of FIG. 1 Examples of non-volatile memory include read-only memory, flash memory, hard disks, floppy disk drives, and magnetic tape. The nonvolatile memory system shown uses flash memory in a memory card that has a standard interface to connect with a variety of hosts. The memory system is connected to a host 220, and stores data for the host. The host 220 may be a Personal Computer (PC), digital camera, MP3 player, Personal Digital Assistant (PDA), cell phone or other electronic device. Data is transferred through memory controller 200 to and from the interface 218. A bus interface (not shown) can further provide the connection between the memory system 222 and the host 220.

Figure 2B:
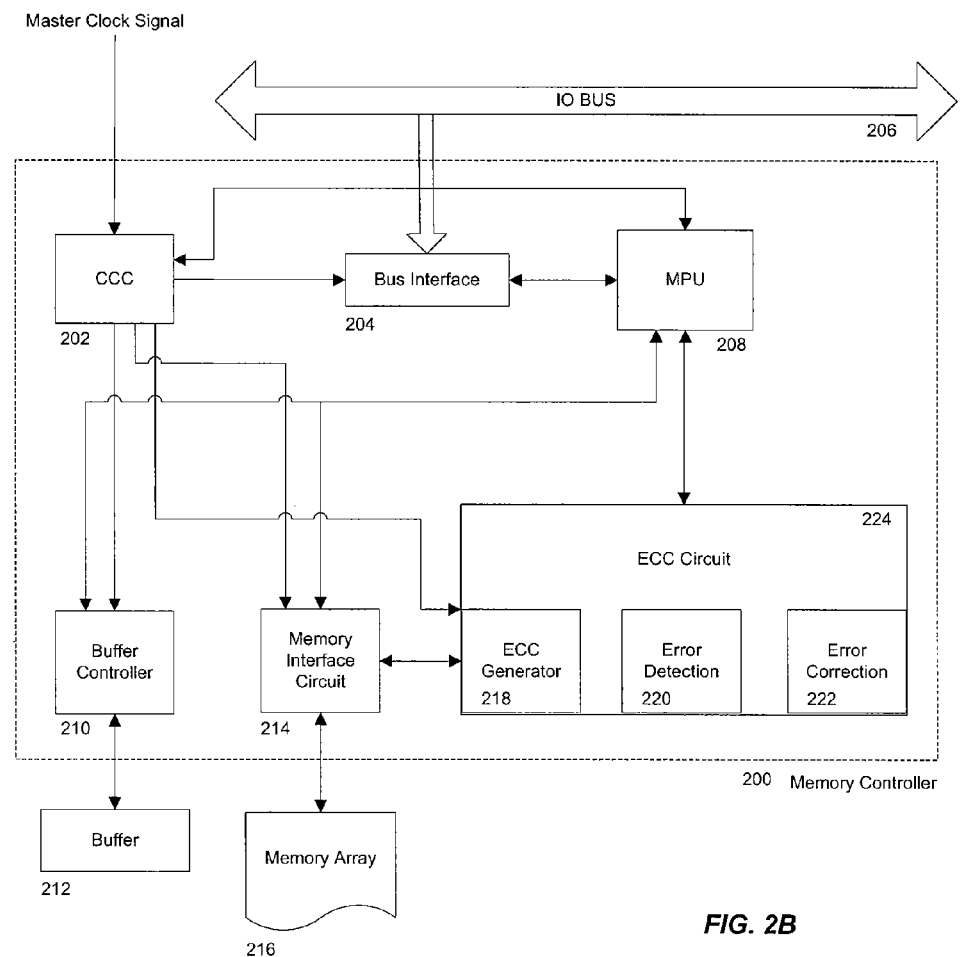
FIG. 2B shows the memory controller of FIG. 2A in more detail.

FIG. 2B shows a particular embodiment of the memory controller 200 in FIG. 2A. Memory controller 200 may include a memory interface circuit 214, which interfaces with memory array 216, a microprocessor ("MPU") 208 for controlling the operation of the controller, clock control circuit 202, ECC circuit 224, a bus interface 204, and a buffer controller 210 for interfacing with buffer 212. Memory controller 200 generates the necessary signals to control the reading and writing of information from and to memory array 216, and interfaces the memory with the other major parts of an electronic system through bus interface 204 and I/O bus 206.

An exemplary MPU 208 may include a central processing unit, along with other components such as registers, timers, and work queues. Together, the MPU controls the overall operation of memory controller 200. MPU 208 also receives a clock signal from clock control circuit 202, which sets the pace at which MPU 208 operates. MPU 208 also controls bus interface 204, which functions to interface the memory controller with the system, which can be, for example, a host computer, via I/O bus 206. Another function of the MPU is to manage the clock control circuit 202 and its generation of the derived clock signals.

Buffer controller 210 controls memory access operations of data buffer 212 according to instructions from MPU 208. Buffer 212 temporarily stores data from the bus interface 204 or data for output to the bus interface 204. It also temporarily holds data read from, or data to write to, the memory array 216. Memory interface circuit 214 controls read/write/erase operations applied to the memory array 216 according to instructions from MPU 208. Both the buffer controller 210 and memory interface 214 receive clock signals from the clock control circuit 202.

ECC circuit 224 can include sub-components including ECC generator 218, error detection circuit 220, and error correction 222. ECC circuit 224 receives a clock signal from clock control circuit 202, whose frequency determines the processing speed of ECC operations. ECC generator 218 generates an error-correcting code which is used to later automatically detect and correct data signal errors. Different types of codes can detect and correct different numbers of bit errors. For example, Hamming codes, which are well-known in the field, can correct single-bit errors and detect double-bit errors. More sophisticated codes are capable of detecting and correcting more errors. Other types of error correcting codes include BCH, Reed-Solomon, Reed-Muller, Binary Golay, and low-density parity-check codes. When MPU 208 writes to memory array 216 via the memory interface circuit 214, ECC generator 218 generates an error code that is added to write-data by ECC circuit 224 and is stored in memory array 216.

When MPU 208 reads from memory array 216, error detection circuit 220 detects the number of errors in the data read. There are many well-known error detection schemes in the art, including repetition, party, and polarity schemes, cyclic-redundancy and Hamming distance based checks, and checksums. All of these methods work by adding redundancy so that errors in the data may be detected and corrected. The different types of error correcting codes discussed above are specific implementations of these error detection schemes. ECC circuit 224 further includes an error correction circuit 222 to correct the detected errors. Error detection by detection circuit 220 is followed by error correction by correction circuit 222 if errors are detected. In some cases, error detection and correction are performed by a single circuit, but may also be performed successively, with correction only being necessary where errors are detected. Error correction is dependent on the error-correction code and scheme chosen.

The amount of calculation needed to correct errors in data depends on the number of errors in the data. Thus, the work load of ECC circuit 224 may vary widely from one portion of data to another. When data is read that has a large number of errors, the work load may be heavy and when the data is read that has a small number of errors, the work load may be light. At times when the work load is heavy, there is a danger that a power limit for the memory system could be exceeded, particularly if other components are using significant power. At times when the work load is light, the system could be wasting power resources due to unused clock cycles while the ECC circuit waits for more work. To better balance the clock signal frequency of the ECC circuit, the MPU or some other dedicated circuitry can function as a regulation circuit to monitor and predict when the ECC's work load changes, or is likely to change. When the ECC circuit's work load is predicted to increase/decrease, the regulation circuit can instruct the clock control circuit to increase/decrease the ECC circuit's clock signal frequency. The regulation circuit can further adjust the clock speeds of other circuits to ensure that any power constraints are not exceeded. For example, the regulation circuit can slow down the buffer controller while the ECC circuit's work load is high such that the overall power usage threshold is not exceeded. In addition, the power usage threshold may change depending on the power usage conditions of the electronic device.

There may be other constraints for the regulation circuit to consider in balancing clock speeds. In asynchronous systems where various components operate with different clock speeds, pipeline performance and control become important issues. In such systems, a pipeline could consist of a set of data processing elements connected in series, so that the output of one element is the input of the next. For example, the memory interface, buffer controller, and ECC circuit could be pipelined together such that data read from the memory interface is stored in the buffer, which is then fetched by the ECC circuit for error detection and correction processing. In nonvolatile memory systems, errors are often detected and corrected "on-the-fly", meaning error detection and correction is done at the same rate as data is being read from the memory array. This means that the ECC circuit's clock speed must be adjusted in relation with other pipeline components such as the memory interface and buffer in order to meet the "on-the-fly" performance requirement. In general, if one component in such a series of components is slower, it may have its clock frequency increased, while other components in the series have their clock frequencies decreased thereby allowing data to flow at a consistent speed and avoiding bottlenecks.

While ECC circuits are a useful example of a component in an electronic system that may have different power needs, many other components also have variable power usage. For example, memory systems often include garbage collection to reclaim memory resources that are stale and no longer being used. Garbage collection becomes more important when the memory system is running out of memory; in these situations, the clock speed for the garbage collection component can be increased such that garbage collection can be performed faster. When there is less garbage to be collected, the memory system can then decrease the clock speed for this component to conserver power resources. Another example is in the context of processing read data from a peripheral device such as a CD drive. In this case, the CD drive's read speed may be pipelined with the device's ability to process data read from the CD drive such that adjustments in the processing speed to one component may need to be done with reference to the other. Similar to the ECC circuit, a device may also include encryption/decryption logic that can be used to enable digital content protection. For example, the device may use a security key to encrypt all data to be sent over a host interface where only authorized hosts know the corresponding key to decrypt and view the encrypted data. This encryption logic circuit may also be pipelined and its clock speed may need to be adjusted in conjunction with other components in the data pipeline in order to prevent bottlenecks.

Figure 3:
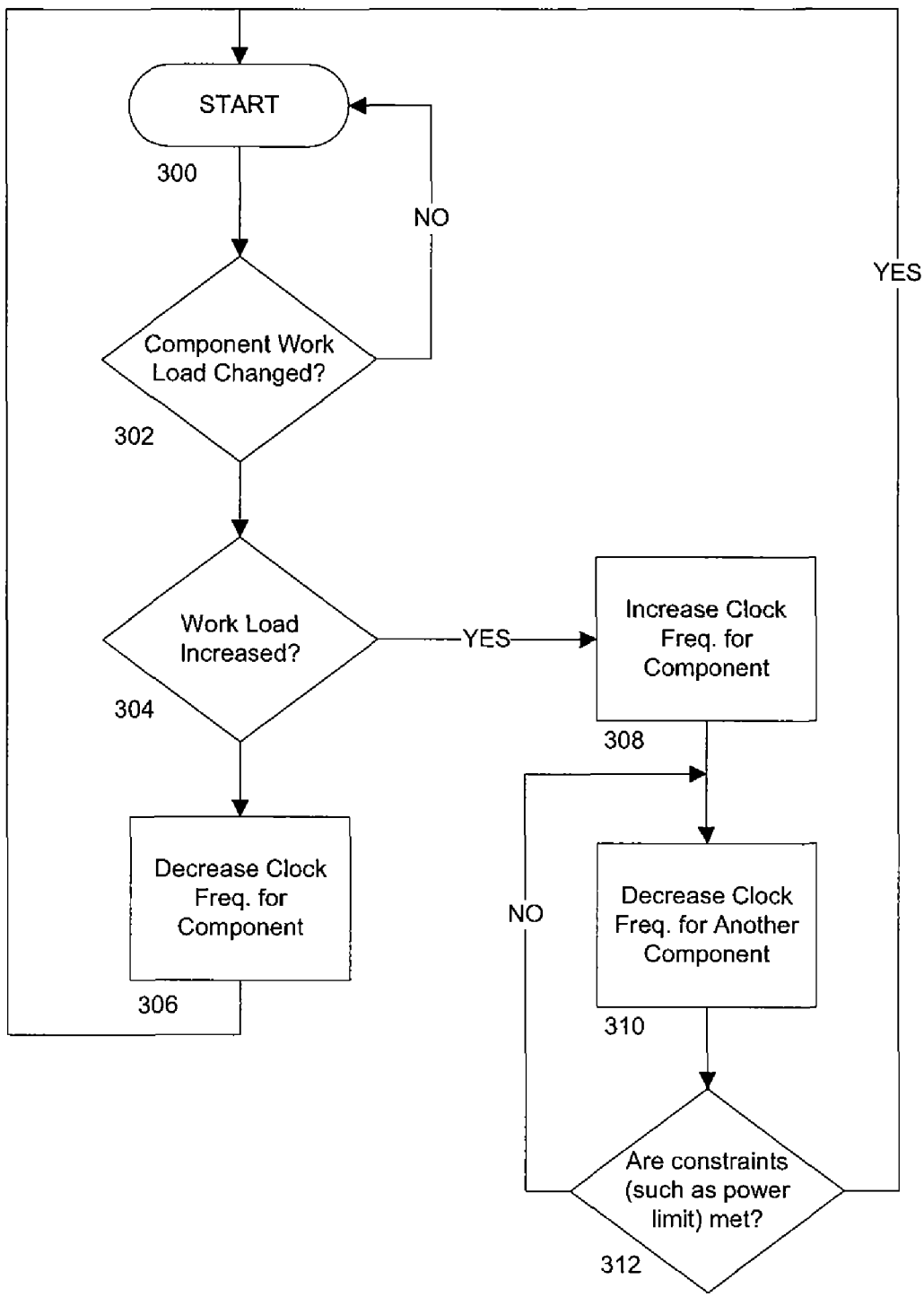
FIG. 3 shows a flowchart for balancing the frequencies of a group of clock signals.

FIG. 3 shows a flowchart for balancing the frequencies of a group of clock signals. In one embodiment, these steps can be implemented in a clock control circuit such as clock control circuit 102 in electronic device 100, as controlled by some control component such as microprocessor 104. The process involves monitoring the components in electronic device 100 in order to determine in step 302 when a component's work load has changed and/or predict when a component's work load is likely to change. Monitoring components enables the process to determine when a component's work load has changed. For example, a component's work queue can be constantly monitored to determine in real-time when the component becomes heavily loaded with work. When this change is detected, the process can then respond by increasing (or decreasing) the component's clock rate. Prediction, on the other hand, attempts to predict a change in a component's work load before the change actually occurs. Prediction is related to monitoring because it often relies on information gathered from monitoring to make the predictions. For example, if analysis shows that component A's work load increases proportionally with increases in component B's work load, then it can be predicted that component A's work load will increase when an increase in component B's work load is detected.

Prediction analysis can be performed by a microprocessor or some other dedicated circuitry along with monitoring functionality. For example, a microprocessor could monitor the ECC circuit to predict when the ECC circuit needs more processing power. One method of predicting changes to the work load of the ECC circuit is to monitor the number of errors that the ECC circuit detects; many detected errors is a reliable heuristic that the ECC circuit will require more processing power than normal to correct the large number of data errors. Various data gathered from the electronic device can also be statistically analyzed and modeled to make predictions about future work loads. There are many well-known methods of statistical analysis of this type, including regression models which establish a mathematical equation as a model to represent the interactions between the different variables in consideration. The predictive analytics gathered can be used to predict when it is statistically likely that the ECC circuit will encounter changes in its work load.

Other methods for predicting work load changes include monitoring different components such as a memory array. For example, the electronic device may monitor its memory array for defective columns or blocks, and record this information in a look-up table. When data is subsequently read from the memory array, the data location read from can be checked against the look-up table to determine if the location is from a previously-determined problematic area. If so, the microprocessor could predict that there will be a large number of errors from the faulty memory array region.

In another example, erroneous data might be predicted according to a hot count for the block in which such data is stored. The hot count indicates the number of times the block has been erased, and thus indicates the amount of wear the block has undergone. The number of errors in the data read generally increases with wear. So data from a block with a high hot count may be expected to have a higher number of errors than one with a low hot count.

In another example, erroneous data may be indicated by the distribution of threshold voltages that are sensed when data is read from the memory array. If memory cells generally have distributions that are narrow, within the assigned threshold voltage ranges, a small number of errors may be expected. If distributions are wide, or not centered in threshold voltage ranges associated with memory states, then a large number of errors may be expected.

Lastly, the ECC component's work queue could also be monitored; when the number of tasks in this queue increases, the microprocessor 104 could predict that the ECC circuit may soon need more processing power to handle the backlog of work that needs to be processed.

When a change in the work load of a component is predicted, the system can proactively respond to this prediction by increasing or decreasing the clock frequency for the component. For example, if it is predicted in step 304 that the ECC circuit will need to correct a large number of errors, the microprocessor can in step 308 instruct the clock control circuit to increase the frequency of the ECC circuit's clock signal. The increased clock speed will then allow the ECC circuit to process the data at a faster speed. When the ECC circuit's clock signal frequency is increased, however, the system may need to decrease the clock frequency of another component in step 310 in order to stay within the electronic device's power usage threshold. Thus, the microprocessor may decrease the clock signal frequency for another component that may not currently need as much processing power. This may be done for multiple components in step 312 until the operating constraint is met. Furthermore, there could be pipeline dependencies between various components in the electronic device which could require not only power constraint balancing, but performance balancing as well. For example, an increase in the processing power need of the ECC circuit may also require the system bus to operate at a faster speed. Thus, the system may face two constraints, one being the power usage threshold and the other the pipeline performance dependencies, in balancing a group of clock signal frequencies. If instead of an increase, a decrease in processing-needs of a component is detected, the system can decrease that component's clock signal frequency in step 306 in order to conserve power resources; alternatively, if the power level is not a concern, then this step can be skipped.

Figure 4:
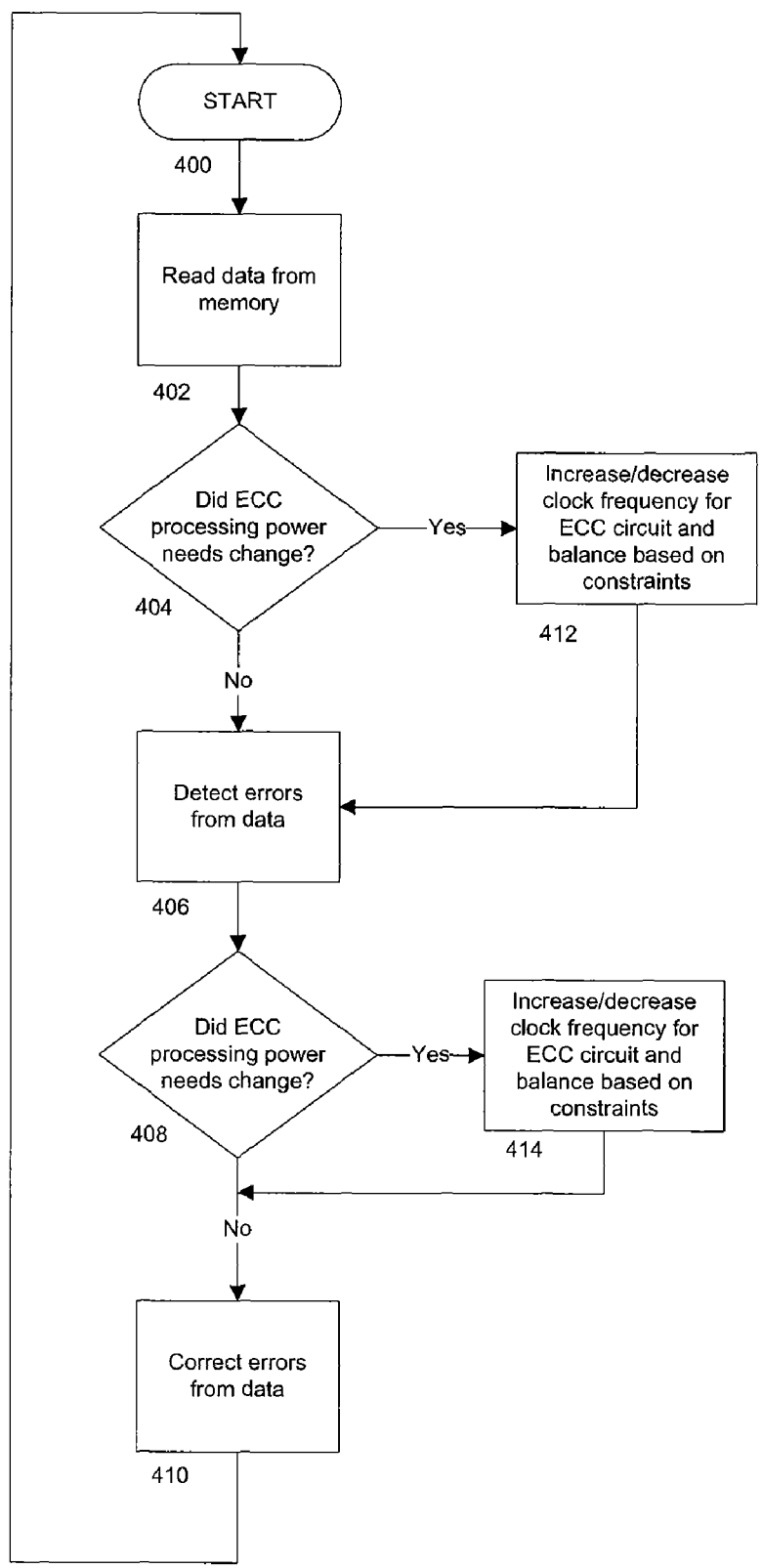
FIG. 4 shows a flowchart of an embodiment of the present invention for balancing clock signal frequencies in a memory controller device with an ECC circuit.

FIG. 4 shows a flowchart of an embodiment for balancing clock signal frequencies in a memory controller device with an ECC circuit such as memory controller 200 in FIG. 2. As discussed above, in certain memory controllers, ECC functionality can often times require a significant increase in processing power needs due to a combination of hard and soft memory data errors. Such memory controllers may also face significant power supply constraints. The process starts in step 400 by reading data from a memory array in step 402 and predicting in step 404 whether the ECC circuit's processing power needs have changed. If so, the MPU in step 412 can increase the ECC circuit's clock signal frequency in response to a predicted increase in processing need, or decrease the ECC circuit's clock signal frequency in response to a predicted decrease in processing need. Based on changes to the ECC circuit's clock signal frequency, the MPU can then adjust other clock speeds in order to satisfy any power usage and/or pipeline performance constraints.

Next in step 406, the ECC circuit detects the errors from the data read. The error detection step could generate information that can be used to predict a change in processing power needs in step 408. As discussed above, for example, a large number of detected errors can be a predictive heuristic that the ECC circuit will need more processing power. If such a prediction is made, then the MPU in step 414 can adjust and balance the clock signal frequencies in the same manner as before. Finally, the errors are corrected in step 410 by the ECC circuit and the process can begin again.

Although the various aspects of the present invention have been described with respect to particular embodiments, it will be understood that the invention is entitled to protection within the full scope of the appended claims.

What is claimed is:

1. A memory controller in a semiconductor memory device having a plurality of memory cells comprising:
    a clock control circuit that receives a master clock signal and generates one or more clock signals;
    an error detection and correction code (ECC) circuit that performs error detection and correction processing;
    an ECC clock signal, with an ECC clock signal frequency, that is generated by the clock control circuit and sent to the ECC circuit; and
    a regulation circuit for predicting a change in the ECC circuit's work load, wherein the ECC clock signal frequency is increased or decreased based on predicted changes in the ECC circuit's work load.

2. The memory controller of claim 1 wherein the regulation circuit for predicting a change in the ECC circuit's work load monitors a number of errors detected by the ECC circuit.

3. A memory controller in a semiconductor memory device having a plurality of memory cells comprising:
    a clock control circuit that receives a master clock signal and generates one or more clock signals;
    an error detection and correction code (ECC) circuit that performs error detection and correction processing;
    an ECC clock signal, with an ECC clock signal frequency, that is generated by the clock control circuit and sent to the ECC circuit;
    a regulation circuit for predicting a change in the ECC circuit's work load, wherein the ECC clock signal frequency is increased or decreased based on predicted changes in the ECC circuit's work load; and
    a logic circuit that receives a clock signal, with a clock signal frequency, from the clock control circuit where the clock signal frequency is increased or decreased in response to a change in the ECC clock signal frequency, by an amount of that is inversely proportional to the change in the ECC clock signal frequency.

4. A method of balancing power consumption of a memory controller including an error detection and correction code (ECC) circuit that receives an ECC clock signal, comprising:
    predicting a processing power need of the ECC circuit needed to process a portion of data;
    increasing the ECC clock signal's frequency when the predicted processing power need of the ECC circuit is predicted to increase and decreasing another logic circuit's clock signal frequency; and
    decreasing the ECC clock signal's frequency when the predicted processing power need of the ECC circuit is predicted to decrease.

5. The method of claim 4 wherein predicting a processing power need of the ECC circuit includes predicting a processing power need of the ECC circuit to process a portion of data that the memory controller reads from a memory array.

6. The method of claim 5 wherein predicting a processing power need of a ECC circuit comprises:
    reading a portion of data from a memory array;
    detecting errors from the portion of data; and
    predicting a processing power need of the ECC circuit to correct the detected errors from the portion of data.

* * * * *